United States Patent [19]
DiPaolo et al.

[11] Patent Number: 5,587,095
[45] Date of Patent: *Dec. 24, 1996

[54] PROCESS AND APPARATUS FOR CONTAMINATION-FREE PROCESSING OF SEMICONDUCTOR PARTS

[75] Inventors: Nunzio DiPaolo, Poughkeepsie; Daniel J. Ferguson, Marlboro, both of N.Y.

[73] Assignee: International Business Machines Corporation, Armonk, N.Y.

[*] Notice: The term of this patent shall not extend beyond the expiration date of Pat. No. 5,471,033.

[21] Appl. No.: 518,054

[22] Filed: Aug. 22, 1995

Related U.S. Application Data

[63] Continuation of Ser. No. 227,937, Apr. 15, 1994, Pat. No. 5,471,033.

[51] Int. Cl.⁶ .................................................. F27B 9/06
[52] U.S. Cl. ............................................ 219/388; 219/390
[58] Field of Search ..................... 219/388–399, 219/389, 390, 391–398

[56] References Cited

U.S. PATENT DOCUMENTS

| | | | |
|---|---|---|---|
| 4,412,812 | 11/1983 | Sadowski et al. | 432/121 |
| 4,472,622 | 9/1984 | Satoh et al. | 219/390 |
| 4,543,059 | 9/1985 | Whang et al. | 432/11 |
| 4,554,437 | 11/1985 | Wagner et al. | 219/388 |
| 4,693,211 | 9/1987 | Ogami et al. | 118/725 |
| 4,695,706 | 9/1987 | Mizushina | 219/390 |
| 4,721,836 | 1/1988 | Zeisse et al. | 219/385 |
| 4,820,907 | 4/1989 | Terauchi et al. | 219/494 |
| 4,857,689 | 8/1989 | Kee | 219/518 |
| 4,886,954 | 12/1989 | Yu et al. | 219/390 |
| 4,903,754 | 2/1990 | Hirscher | 154/1 |
| 4,950,870 | 8/1990 | Mitsuhashi et al. | 219/390 |
| 4,966,547 | 10/1990 | Okuyama et al. | 432/9 |
| 4,982,347 | 1/1991 | Rackerby et al. | 364/557 |
| 5,054,418 | 10/1991 | Thompson et al. | 118/500 |
| 5,421,723 | 6/1995 | Katz et al. | 432/78 |

*Primary Examiner*—Tu Hoang
*Attorney, Agent, or Firm*—Aziz M. Ahsan

[57] ABSTRACT

This invention relates generally to a process and apparatus for contamination-free processing of semiconductor parts. More specifically, this invention relates to a process and apparatus for contamination-free processing of semiconductor parts in an oven or a furnace. This invention also relates to a process and apparatus for contamination-free processing of semiconductor parts in a furnace, such as a belt type furnace that sequentially stops the belt at the vicinity of at least one heating or cooling unit to heat or cool the part.

12 Claims, 2 Drawing Sheets

PROCESS AND APPARATUS FOR CONTAMINATION-FREE PROCESSING OF SEMICONDUCTOR PARTS

CROSS-REFERENCE TO A RELATED PATENT APPLICATION

This patent application is a Continuation of U.S. patent application Ser. No. 08/227,937, filed on Apr. 15, 1994, which issued as U.S. Pat. No. 5,471,033, on Nov. 28, 1995.

FIELD OF THE INVENTION

This invention relates generally to a process and apparatus for contamination-free processing of semiconductor parts. More specifically, this invention relates to a process and apparatus for contamination-free processing of semiconductor parts in an oven or a furnace. This invention also relates to a process and apparatus for contamination-free processing of semiconductor parts in a furnace, such as a belt type furnace that sequentially stops the belt at the vicinity of at least one heating or cooling unit to heat or cool the part.

BACKGROUND OF THE INVENTION

For many years the electronics or semi-conductor industry has been using various types of ovens and furnaces for high volume heating and/or cooling applications. In the oven and furnace industry many inventions have occurred. However, most of them have been directed to innovations in either cooling or heating of the parts that are being processed.

U.S. Pat. No. 4,554,437 (Wagner et al.) discloses a continuous speed belt type tunnel oven which allows a user to select different top and bottom temperatures within each of the plural cooking zones.

U.S. Pat. No. 4,693,211 (Ogami et al.) discloses a surface treatment apparatus, which is composed of a supporting die for holding a substrate thereon to heat and/or cool the substrate. A cover defines a treatment space over the entire surface of the substrate on the supporting die. Preferably, a heat-insulating housing could be outside the cover.

U.S. Pat. No. 4,886,954 (Yu et al.) discloses a hot wall diffusion furnace and a method for operating the furnace. Yu et al. disclose that the heating elements in the upper section of the furnace be connected to one circuit, and the heating elements of the lower section of the furnace be connected to a second circuit, and that each circuit be controlled in response to the temperature in that section, so that uniform temperature can be obtained in the processing chamber.

U.S. Pat. No. 4,903,754 (Hirscher) discloses a method and apparatus for the transmission heat to or from plate like object. The plate-like object, such as a Si wafer, is held on a back plate and inside a cover. This patent discloses both the heating and cooling of the plate-like object.

U.S. Pat. No. 4,950,870 (Mitsuhashi et al.) discloses a heat-treating apparatus having at least three heaters and the power to these heaters can be supplied from independent power sources so that the heating temperatures of the individual heaters can be freely adjusted. Additionally, the multiple heaters in the vertical furnace attain a uniform heat distribution throughout the heating zone.

U.S. Pat. No. 4,966,547 (Okuyama et al.) discloses a heat treatment method using a zoned tunnel furnace. The furnace has roller conveyer and each of the zones in the furnace walls are provided with electric resistance heating wires. The heaters in each zone are under programmed control, independent of the heaters in the other zones. Similarly, the roller conveyer in each zone can be driven independent of the roller conveyer in the other zones by programmable controllers.

U.S. Pat. No. 4,982,347 (Rackerby et al.) discloses a process and apparatus for producing temperature profiles in a workpiece as it passes through a belt furnace. Each of the heaters has their own separate thermostats, which enables the temperature of each heater to be separately set. Thus a workpiece can be subjected to a temperature profile which varies from heater to heater along the passageway.

U.S. Pat. No. 5,054,418 (Thompson et al.) discloses a device for holding wafers of semi-conducting materials during thermal processing or coating, where the device is a cage boat having removable slats.

The parts or products using conventional furnaces and ovens have changed over time. Some of the parts have been getting larger and others are getting smaller, and still other require more stringent processing controls. Therefore, it has become increasingly difficult to do the same type of processing on the parts, as done by the ovens and furnaces known in the art.

For some parts the thermal mass or thermal weight resists being heated quickly, and therefore they may have to be processed for a longer period. Another factor is that newer and different materials are being used to make these parts, and these newer materials require different heating regimes. These issues are further compounded by the fact that now closer temperature control and lower intra-part gradients are being required by the electronics industry.

The manufacturers of conventional ovens and furnaces have made quite a few upgrades to their system in response to the industrial needs. Some upgrades include providing better and more efficient gas flows. Others have provided improved zone separation. And, still others are providing better cooling in the cool down section. Most of these changes are required because the parts or products are less tolerant to thermal process irregularities and the resultant mechanical stresses, etc.

Another problem faced in the use of conventional ovens or furnaces is that when flux or similar contaminants are used in a conventional oven or furnace they get deposited on the walls of the furnace creating a contamination problem for the furnace as well as the parts that are being processed in the furnace. Flux and similar contaminants results from many processes, such as a soldering process, and therefore cannot be eliminated. Similarly, there are other solvents which evaporate from the surface of the part, as the part is being heated, and they enter the flow of the gases in the furnace, flowing from the hotter end or area to a colder area. This causes the vaporized solvents and similar other material to condense on cooler furnace areas or parts and this collects as contamination.

For an application, such as chip join, the operation is characterized by loading many parts on a belt, followed by continuous movement of the belt through the furnace's heating and/or cooling areas, and thus it is not very practical to stop and clean the furnace for a different part and/or a different process.

Therefore, during a typical high volume heating and/or cooling applications care must be taken to prevent the parts being processed from being contaminated with contaminants that are inside the furnace, and that the contamination be kept to the minimum.

For the above-mentioned reasons, parts cannot always be processed within specification using the conventional ovens or furnaces, and therefore there is a need for improvement in the furnace and oven industry.

The above-mentioned and other problems have been overcome by the novel apparatus and the process of this invention.

BRIEF SUMMARY OF THE INVENTION

In one aspect the invention comprises a process for processing a part in a contaminating environment wherein said part is protected from said contamination, comprising the steps of:

(a) placing said part on a part carrier in a first environment, (b) placing a cover over said part carrier and enveloping said part so as to form a boat, (c) removing said boat from said first environment, (d) placing said boat in a second, more contaminating, environment and processing said part.

In another aspect the invention comprises an apparatus for processing at least one part comprising a covered boat enveloping said part and having a first environment while said apparatus having a second more contaminating environment, wherein said covered boat is placed inside said apparatus and further comprising at least one means for processing said part.

PURPOSES OF THE INVENTION

One purpose of this invention is to provide a process that is very economical.

Another purpose of the invention is to provide a process that is easily adaptable to the existing ovens and furnaces.

Still another purpose of this invention is to provide a system that transports the parts through a contaminating environment without contaminating the part.

Yet another purpose of this invention is to process the part such that the part is itself in a less contaminated environment than its surroundings.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention may be best understood by the description which follows, taken in conjunction with the accompanying drawings in which:

DETAILED DESCRIPTION OF THE INVENTION

Figure 1:
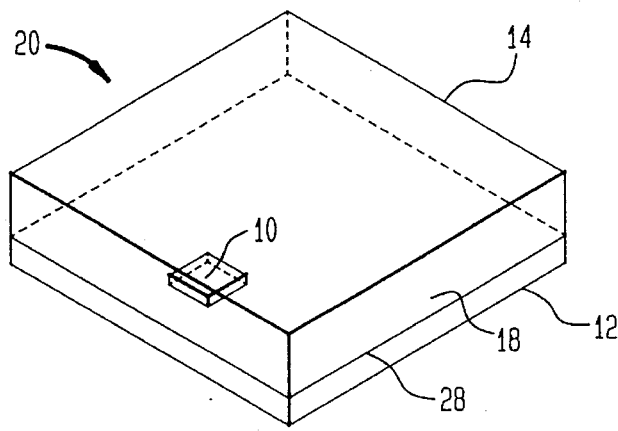
FIG. 1, is a perspective view of a preferred embodiment of the present invention.

The preferred embodiment of the invention is illustrated in FIG. 1, where a part or a substrate 10, to be processed is placed on a base 12, and is protected from the environment by a cover 14. The base 12, having an upper surface 18, is typically made from quartz, glass, metal, etc. Similarly, it is preferred that the cover 14, having peripheral base edge 28, be also made from quartz, glass, metal, to name a few.

In a typical application the substrate 10, is placed on the upper surface 18, of the base 12, for example, in a Class 10 clean room, and then the cover 14, is subsequently placed to protect the substrate 10, in the same Class 10 clean room. A Class 10 clean room, for example, is a room or area where there are less than 10 particles of not greater than 0.3 micron particle size per cubic foot of air. This way the contamination inside the cover is Class 10, and there is no reason to create a vacuum inside the cover 14, to keep the area inside the cover 14, and over and around the substrate 10, contamination free. The base 12, along with the cover 14, will be referred to as a parts carrier or boat 20.

Figure 2:
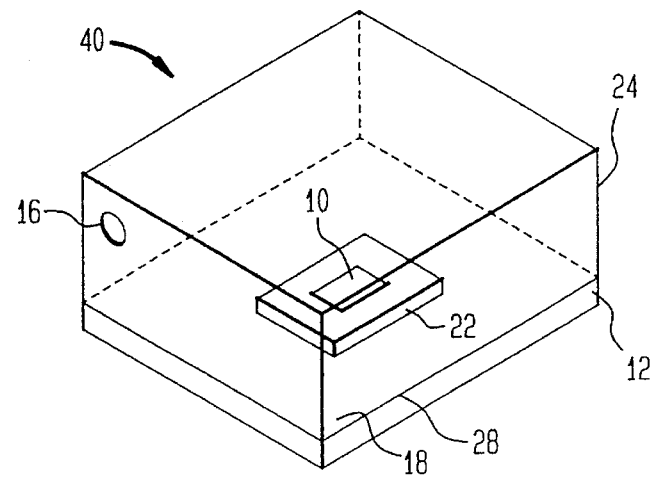
FIG. 2, is a perspective view showing another embodiment of the present invention.

For some applications it may be necessary to create a vacuum or extract certain contaminants out of under the cover 14, and keep the substrate 10, in a contamination free environment. This can be done as illustrated in FIG. 2, where a boat 40, having a cover 24, has at least one vent or plug 16, through which the contaminating gases and/or particles could be extracted. Of course this vent or plug 16, could be on the top of the cover 24, or could be a part of the base 12. The vent or plug 16, could also be used to prevent the creation of a pressure differential between inside and outside of the boat.

FIG. 2, also illustrates that the substrate 10, could also be placed on a substrate or part pedestal or support 22. The substrate pedestal 22, allows the part or substrate 10, to be processed without the need to have the substrate 10, itself be physically moved. For some applications the substrate 10, could be secured to the substrate pedestal 22, by means well known in the art, such as, screws, bolts, clamps, etc.

Figure 3A:
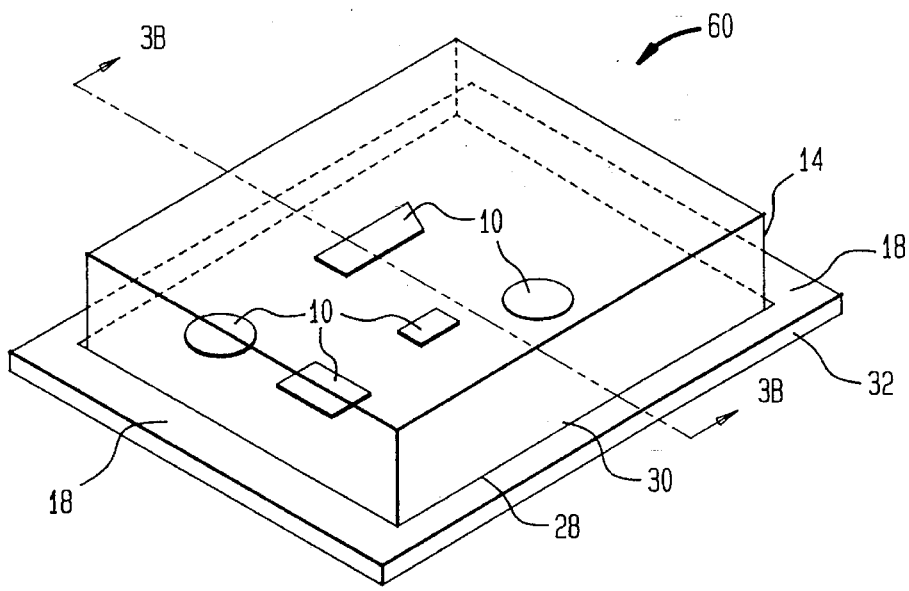
FIG. 3A, is a perspective view showing yet another embodiment of the present invention.
Figure 3B:
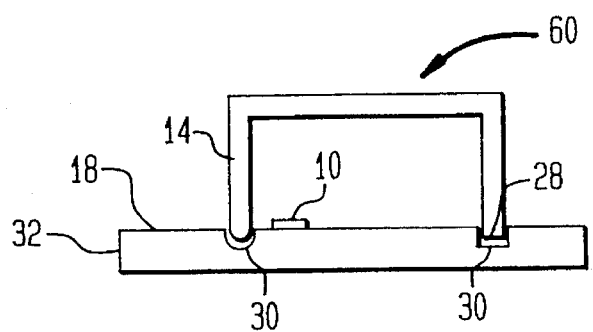
FIG. 3B, is a sectional view taken along section 3B—3B of FIG. 3A.

FIG. 3A, is a perspective view showing yet another embodiment of the present invention, while FIG. 3B is a sectional view taken along section 3B—3B of FIG. 3A. A boat or parts carrier 60, has a base 32, having a groove or a trench or channel 30, to accommodate the peripheral base edge 28, of the cover 14. The base edge 28, could have rectangular-type shape or circular-type shape or polygonal-type shape or a triangular-type shape, to name a few. Of course the trench or channel 30, in the base 32, should have a shape complementary to that of the base edge 28, to provide the maximum seal or contamination free environment to the part 10.

For some applications it may be necessary to put a seal or similar such media between the base edge 28, and the upper surface 18, of the base 12 or 32. Typical seals that are used in the industry are seals made from silicon or polymers, to name a few.

Figure 4:
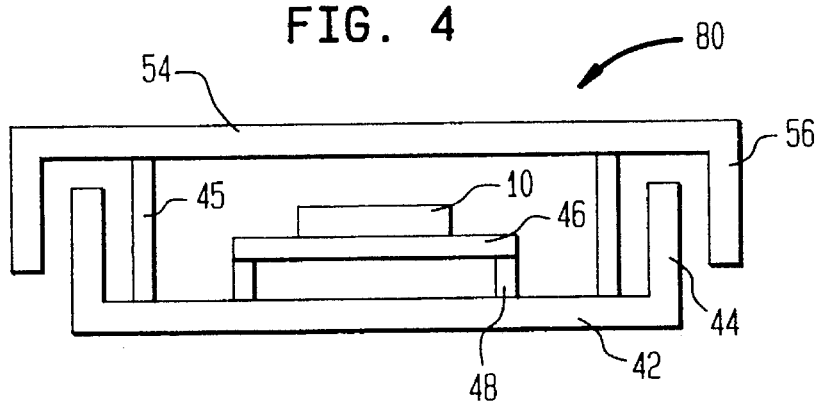
FIG. 4, is a cross-sectional view of still another embodiment of the present invention.

FIG. 4, illustrates a cross-sectional view of a boat or parts carrier 80, which is still another embodiment of the present invention. The boat 80, typically has a pan-shaped base 42, having side-walls 44. The part 10, to be processed could be placed on a support or pedestal 46, having a plurality of posts or stand-offs 48. Cover 54, having ledge 56, is then used to provide a cover for the part 10, and posts or stand-offs 45, typically, separate the cover 54, from the base 42. For some applications, the stand-offs 45 and/or 48, could be made from material that allows the movement of fluid through it. This movement of fluid, such as air, of course will prevent or reduce any pressure differential that might exist between the inside and outside of the boat 80.

Figure 5:
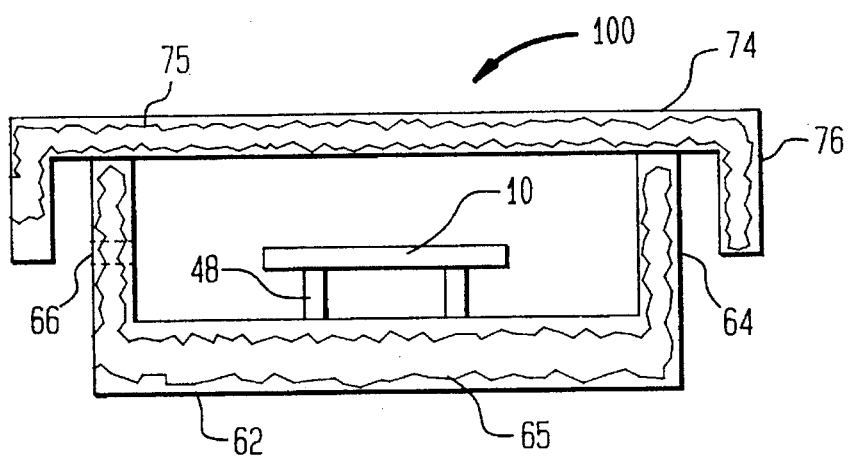
FIG. 5, is a cross-sectional view of still yet another embodiment of the present invention.

FIG. 5, is a cross-sectional view of still yet another embodiment of the present invention showing a boat or parts carrier 100. The boat 100, has a pan-shaped base 62, having side-walls 64. The base 62 and the side-walls 64, could have one or more electrical implants, such as, resistance thermal heater 65, to provide local thermal heating to the part 10, which may be on a plurality of posts or stand-offs 48. A cover 74, having ledge 76, could also have at least one electrical implant or resistance thermal heater 75, to provide local thermal heating to the part 10. The boat 100, could also have one or more breathers or vents 66, to allow for the part to "breathe" or to prevent a pressure differential from occurring inside the boat 100. In some cases the boat 100, could of course itself be placed inside an oven for further processing of the part 10.

The boat 20, 40, 60 or 80, along with the substrate 10, is typically placed in an oven or furnace or a cooling environment and the processing of the part 10, continues.

As will be appreciated that now, for example, the boat 20, can be placed in an oven or a furnace (not shown) that has, for example, a Class 100 or Class 1000 or more environment but the part 10, being in the boat 20, will not be exposed to the outside contamination, and will only see the cleaner, for example, Class 10, environment.

The boat or parts carrier 20, 40, 60 or 80, could also be placed on a sequential belt type furnace, as disclosed in U.S. patent application Ser. No. 07/920,948, entitled "Sequential Step Belt Furnace With Individual Concentric Heating Elements", assigned to the assignee of the instant patent application and the disclosure of which is incorporated herein by reference, and the part 10, could be processed without being contaminated by carrier gasses that might exist in a belt type furnace.

Similarly, the boat or parts carrier 20, 40, 60, 80 or 100, could also be placed on a sequential belt type furnace, as disclosed in U.S. patent application Ser. No. 08/218,105, filed on Mar. 25, 1994, now U.S. Pat. No. 5,421,723, entitled "Sequential Step Belt Furnace With Individual Concentric Cooling Elements" assigned to the assignee of the instant patent application and the disclosure of which is incorporated herein by reference, and the part 10, could be processed without being contaminated by the contaminants that might exist in the furnace.

The part 10, could be an I. C. (Integrated Circuit) chip or a semiconductor substrate or a semiconductor module, or similar such product.

It has been found that the parts 10, described in this invention, could be large parts, such as ceramic substrates which are typically about 100 mm by 100 mm to about 20 mm by 20 mm or smaller parts, such as semiconductor chips which are typically about 10 mm by 10 mm.

The heating or "cooling" is typically provided to the boat 20, 40, 60, 80 or 100, and in-turn to the part 10, by one or more of the upper, lower or side heating or cooling units in a furnace.

If a sequential belt type furnace is used then the boat 20, 40, 60 or 80, is typically accelerated, and then decelerates, and the part 10, is placed typically in the center of the heating or cooling zone. Of course, using a computer or a controller one could program or control or monitor the transit or soak times or the belt speeds, etc.

Using the inventive boat 20, 40, 60, 80 or 100, the contaminating gases or particles or evaporated flux that may exist in an oven or a furnace, never gets an opportunity to condense on the surface of the part.

As one can see that the process and apparatus of this invention provides a substantial improvement over the state of the art.

This inventive furnace can be used for a variety of processes, for example, pin brazing process, chip join process, C4 (Controlled Collapse Chip Connection) bonding, to name a few. (C4 and Controlled Collapse Chip Connection are Trademarks of IBM Corporation, Armonk, N.Y., USA.)

The thermally conductive closed boat or container of this invention provides isolation of the product and shields it from contamination that is generated, such as from the surrounding environment, processing machinery, etc.

The invention also provides a mean to uniformly heat the part while shielding it from the contaminants.

It has also been discovered that the boat or parts carrier having a limited number of holes or openings or vents or material that allow for limited amount of fluid flow does not have any major adverse affect on the part being processed. As a matter of fact the amount of contaminants in a fully sealed boat was not any lower than a similar boat with limited vents that allowed for limited fluid flow.

EXAMPLES

The following examples are intended to further illustrate the invention and are not intended to limit the scope of the invention in any manner.

Example 1

A large sized semiconductor substrate A, was placed inside a contamination control box and then covered. The covered container was then placed inside a Blue M oven and the substrate A was baked at approximately 400° C. After the processing of substrate A, a surface particle count was made and it was found that the surface of substrate A, had 1,228 particles. A similar substrate B, was also processed in the same Blue M oven under the same processing conditions, but on an open boat, and upon inspection a total of 2,312 particles were counted on the surface of substrate B. This is an increase of 1,084 particles after the baking step.

Example 2

A medium sized semiconductor substrate C, was placed inside a contamination control box and then covered. The covered container was then placed inside a Blue M oven and the substrate C, was baked at approximately 400° Centigrade. After the processing of substrate C, a surface particle count was made and it was found that the surface of substrate C, had 221 particles. A similar substrate D, was also processed in the same Blue M oven under the same processing conditions, but on an open boat, and upon inspection a total of 333 particles were counted on the surface of substrate D. This is an increase of 112 particles after the baking step. The surface of both parts C and D, had a coating of a layer of polyimide.

Example 3

A small sized semiconductor substrate E, was placed inside a contamination control box and then covered. The covered container was then placed inside a Blue M oven and the substrate E, was baked at approximately 400° Centigrade. After the processing of substrate E, a surface particle count was made and it was found that the surface of substrate E, had 190 particles. A similar substrate F, was also processed in the same Blue M oven under the same processing conditions, but on an open boat, and upon inspection a total of 257 particles were counted on the surface of substrate F. This is an increase of 67 particles after the baking step. The surface of both parts E and F, had a coating of a layer of approximately 200 angstroms of chromium.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for treating a part in a second environment wherein said part is protected from said second environment, comprising the steps of:
   (a) placing said part on a part carrier in a first environment,
   (b) placing a cover over said part carrier such that said cover entraps material from said first environment while enveloping said part to form a covered boat,
   (c) removing said boat from said first environment, and
   (d) placing said boat in said second environment for treating said part wherein said second environment has more contamination than said first environment.

2. The process of claim 1, wherein said first environment is less than class 100 and said second environment is at least class 100.

3. The process of claim 1, wherein said part carrier is selected from a group consisting of glass, metal and quartz.

4. The process of claim 1, wherein said cover is selected from a group consisting of glass, metal and quartz.

5. The process of claim 1, wherein said second environment is at least class 10.

6. The process of claim 1, wherein said second environment is a furnace.

7. The process of claim 6, wherein said furnace is selected from a group consisting of a vertical furnace, a continuous belt furnace and a sequential belt furnace.

8. The process of claim 1, wherein said part is selected from a group consisting of a semiconductor chip, a semiconductor module and a semiconductor substrate.

9. The process of claim 1, wherein said part is secured to a pedestal on said part carrier.

10. The process of claim 1, wherein said part carrier has at least one trench to accommodate a peripheral base edge of said cover.

11. The process of claim 1, wherein said boat has at least one electrical implant to thermally heat said part.

12. The process of claim 1, wherein said boat has at least one opening to prevent a pressure differential from occurring inside said boat.

* * * * *